United States Patent
Zhang et al.

(10) Patent No.: US 8,509,372 B1
(45) Date of Patent: Aug. 13, 2013

(54) MULTI-BAND CLOCK GENERATOR WITH ADAPTIVE FREQUENCY CALIBRATION AND ENHANCED FREQUENCY LOCKING

(75) Inventors: Yu Zhang, Shanghai (CN); Changming Wei, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 580 days.

(21) Appl. No.: 12/626,256

(22) Filed: Nov. 25, 2009

(51) Int. Cl.
*H03D 3/24* (2006.01)
*G01R 23/00* (2006.01)

(52) U.S. Cl.
USPC .............................. 375/376; 331/44

(58) Field of Classification Search
USPC ..................... 375/373, 375–376; 331/17, 25, 331/34, 44
See application file for complete search history.

(56) References Cited

U.S. PATENT DOCUMENTS

| | | | |
|---|---|---|---|
| 5,636,369 A * | 6/1997 | Perren | 712/209 |
| 7,154,348 B2 | 12/2006 | Lee et al. | |
| 7,495,488 B2 | 2/2009 | Kim | |
| 8,090,335 B1 * | 1/2012 | Bataineh | 455/260 |
| 2002/0075080 A1 * | 6/2002 | Nelson et al. | 331/11 |
| 2008/0157884 A1 * | 7/2008 | Lee | 331/44 |

* cited by examiner

*Primary Examiner* — Khanh C Tran
(74) *Attorney, Agent, or Firm* — Myers, et al.

(57) ABSTRACT

A multi-band clock generator includes a phase-locked loop (PLL) integrated circuit responding to first and second clock signals, and includes a multi-band voltage controlled oscillator (VCO) responding to a multi-bit control word that sets a frequency characteristic curve of the VCO. The multi-band clock generator also includes an adaptive frequency calibration (AFC) circuit responding to the first and second clock signals, and the AFC circuit is configured to look-up a first multi-bit control word during an operation to lock an output clock signal generated by the VCO to a first frequency characteristic curve associated with the first multi-bit control word.

21 Claims, 3 Drawing Sheets

MULTI-BAND CLOCK GENERATOR WITH ADAPTIVE FREQUENCY CALIBRATION AND ENHANCED FREQUENCY LOCKING

FIELD OF THE INVENTION

The present invention relates generally to frequency synthesizers and, more particularly, to wide-band frequency synthesizers using phase-locked loop (PLL) integrated circuits therein.

BACKGROUND OF THE INVENTION

A phase-locked loop (PLL) circuit automatically adjusts a clock signal derived from a voltage controlled oscillator (VCO) until it matches the phase and frequency of a reference clock signal. In frequency lock mode, an adaptive frequency calibration (AFC) circuit compares the frequency of a reference signal with that of a feedback clock signal. After comparing the signals, the AFC can output control bits to adjust the frequency of a VCO output signal. For example, U.S. Pat. No. 7,154,348 to Lee et al., entitled "Frequency Synthesizer Using a Wide-Band Voltage Controlled Oscillator and a Fast Adaptive Frequency Calibration. Method," discloses an AFC circuit which compares the frequency of an output signal of a VCO with an input signal and outputs control bits to the VCO based on the comparison. The VCO of such a frequency synthesizer has a plurality of operating characteristic curves associated therewith. In response to the AFC's control bits, which are output as a result of the signal comparison, the VCO selects one of the plurality of operating characteristic curves, where each operating characteristic curve corresponds to a different control word. After determining the control word and corresponding operating characteristic curve in frequency lock mode, the frequency synthesizer adjusts the phase of the VCO while moving along the selected operating characteristic curve in phase lock mode.

Frequency locking time plays an important role, for example, in radio frequency (RF) synthesizer applications such as wireless communications. As the frequency range covered by a synthesizer increases, the number of VCO operating characteristic curves (or sub-bands) also increases, thus prolonging synthesizer locking time. That is, the broader frequency range translates into a longer time for the VCO output signal to match the frequency of the reference signal. More precisely, the dominant locking time in frequency lock mode is the amount of time needed for the AFC circuit to search for control bits to control the VCO. As illustrated in FIG. 2A, using AFC multi-bit control words cw[k] with k bits, AFC circuits may require as many as $2^k-1$ frequency comparisons to generate control bits for a target multi-bit control word cw[k] for VCO band selection. This type of algorithm starts with a given multi-bit control word cw[k], such as 0000, and then iteratively searches through other multi-bit control words cw[k] until finding the target multi-bit control word cw[k]. Such AFC circuits do not wholly meet the requirements of various applications using wide frequency ranges but requiring fast locking times.

SUMMARY OF THE INVENTION

Embodiments of the present invention include a multi-band clock generator having a phase-locked loop (PLL) integrated circuit and an adaptive frequency calibration (AFC) circuit. According to some embodiments of the invention, a multi-band clock generator may include a PLL integrated circuit that is responsive to the first and second clock signals, and that has a multi-band voltage controlled oscillator (VCO) that is responsive to a multi-bit control word that selects a frequency sub-band of the VCO. Additionally, the VCO may be responsive to a multi-bit control word that sets a frequency characteristic curve of the VCO.

According to further aspects of these embodiments, the multi-band clock generator includes an AFC circuit that is responsive to the first and second clock signals, and the AFC circuit is configured to look-up a first multi-bit control word during an operation to lock an output clock signal generated by the VCO to a frequency sub-band associated with a target multi-bit control word. The sub-band of the VCO can be a frequency characteristic curve. Additionally, the AFC circuit may be configured to look-up the first multi-bit control word from within a programmable device during an operation to lock an output clock signal generated by the VCO to a first frequency characteristic curve associated with the first multi-bit control word.

According to some of these embodiments of the invention, the first multi-bit control word is an estimated control word. Under some circumstances, the estimated control word can be the target control word.

According to further embodiments of the invention, the programmable device includes at least one register that is configured to store a multi-bit control word. Alternatively, the programmable device can include a lookup table that has a plurality of programmable entries. In embodiments including the lookup table, the first clock signal can be a reference clock signal, and the AFC circuit can be configured to detect a frequency of the reference clock signal. Also, the second clock signal can be a feedback clock signal derived from the output clock signal, and the AFC circuit can be configured to detect a frequency of the feedback clock signal and to perform a look-up operation of the first multi-bit control word from within the lookup table based on the frequency difference between the reference clock signal and the feedback clock signal. The programmable entries in the lookup table can be derived from simulation results. The simulation results may associate each multi-bit control word with a corresponding output clock signal at a certain VCO tuning voltage. In some embodiments, the VCO tuning voltage may be determined by a reference voltage.

According to some embodiments, the AFC circuit is configured to select a first multi-bit control word using a jumping algorithm during an operation to lock an output clock signal generated by the VCO to a frequency sub-band associated with a target multi-bit control word. The jumping algorithm may select the first multi-bit control word by jumping to a given point among a plurality of multi-bit control words. The given point may be a midpoint among the plurality of multi-bit control words. Also, the given point may be determined by a reference voltage.

According to further embodiments of the invention, the jumping algorithm ignores multi-bit control words having binary values greater than the first multi-bit control word when the target multi-bit control word is determined to have a binary value smaller than the first multi-bit control word. Similarly, the jumping algorithm may ignore multi-bit control words having binary values smaller than the first multi-bit control word when the target multi-bit control word is determined to have a binary value greater than the first multi-bit control word.

DETAILED DESCRIPTION OF EMBODIMENTS

Figure 1:
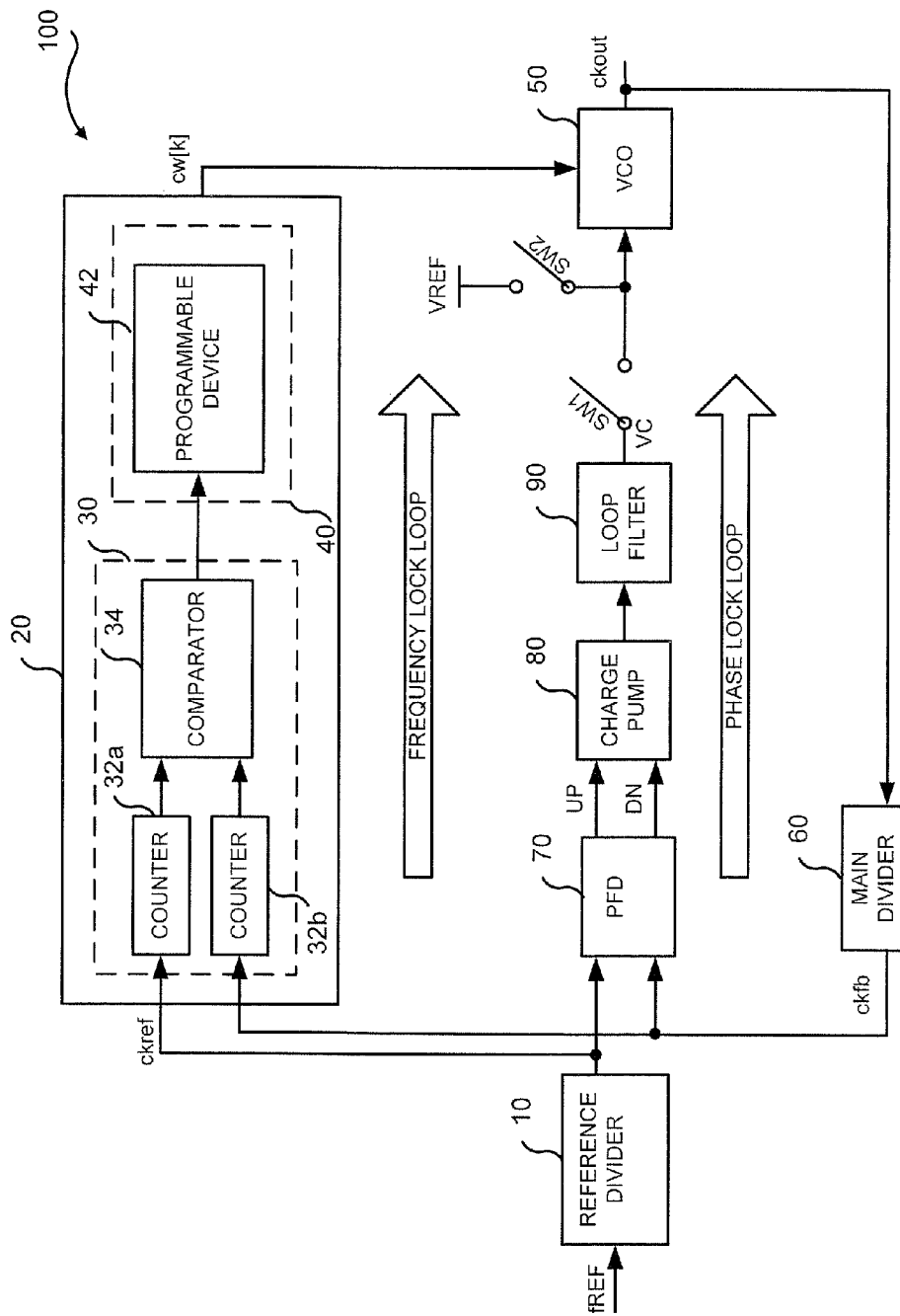
FIG. 1 is a block diagram of a multi-band clock generator according to embodiments of the present invention.

The present invention now will be described more fully herein with reference to the accompanying drawings, in which various embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. Like reference numerals refer to like elements throughout and signal lines and signals thereon may be referred to by the same reference characters.

It will be understood that, although the terms first, second, third, etc. may be used herein to describe various elements, components, and/or sections, these elements, components, and/or sections should not be limited by these terms. These terms are used only to distinguish one element, component, or section from another element, component, or section. The first element, component, or section discussed below could be termed a second element, component, or section without departing from the teachings of the present invention.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Referring now to FIG. 1, a multi-band clock generator 100 according to embodiments of the present invention is illustrated as including a phased-locked loop (PLL) integrated circuit and an adaptive frequency calibration (AFC) circuit 20. Specifically, the multi-band clock generator 100 is illustrated as including a reference divider 10, the AFC circuit 20, a voltage controlled oscillator (VCO) 50, a main divider 60, a phase frequency detector (PFD) 70, a charge pump 80, a loop filter 90, and two switches SW1 and SW2. The PLL includes the PFD 70, the charge pump 80, the loop filter 90, the two switches SW1 and SW2, the VCO 50, and the main divider 60. The AFC circuit 20 may include a frequency detector 30 and a state machine 40. The frequency detector 30 may include counters 32a and 32b and a comparator 34. The state machine 40 may include a programmable device 42. The components of the multi-band clock generator 100 are connected as illustrated.

The PLL is responsive to first and second clock signals. The first and second clock signals include a reference clock signal ckref and a feedback clock signal ckfb. The reference clock signal ckref may be derived from an input clock signal to the reference divider 10, fREF. The PLL includes the VCO 50, which is responsive to a multi-bit control word cw[k] and which may select a frequency sub-band associated with the VCO 50. Also, the VCO 50 may be responsive to a multi-bit control word cw[k] that sets a frequency characteristic curve of the VCO 50. The VCO 50 produces an output clock signal ckout.

As with the PLL, the AFC circuit 20 is responsive to first and second clock signals. The AFC circuit 20 may be configured to look-up a first multi-bit control word cw[k] from within the programmable device 42 during an operation to lock a clock signal, such as the output clock signal ckout generated by the VCO 50 to a frequency sub-band associated with a target multi-bit control word cw[k]. The clock signal locked to the frequency sub-band associated with a target multi-bit control word cw[k] may also be the feedback clock signal ckfb derived from output clock signal ckout. Furthermore, frequency sub-bands associated with the VCO 50 may also be known as frequency characteristic curves. Also, the AFC circuit 20 may be configured to look-up the first multi-bit control word cw[k] from within the programmable device 42 during an operation to lock the output clock signal ckout generated by the VCO 50 to a first frequency characteristic curve associated with the first multi-bit control word cw[k].

During a frequency lock operation, the switch SW2 is closed and the switch SW1 is open, thus forming a frequency-lock loop FREQUENCY LOCK LOOP. Alternatively, during a phase lock operation, the switch SW1 is closed and the switch SW2 is open, thus forming a phase-lock loop PHASE LOCK LOOP. When switch SW1 is closed, it provides a voltage VC of the loop filter 90 to the VCO 50. When switch SW2 is closed, it provides a reference voltage VREF to the VCO 50.

The PFD 70 compares the phase of the reference clock signal ckref with the phase of the feedback clock signal ckfb and generates either an up UP or a down DN signal based on the comparison. As is known to those skilled in the art, the charge pump 80 then responds to this signal by charging or discharging the loop filter 90.

During the frequency lock operation, the counters 32a and 32b count the frequency of the first and second clock signals and the comparator 34 outputs the comparison result to the state machine 40. In some embodiments, the programmable device 42 included within the state machine 40 has at least one register configured to store a multi-bit control word cw[k]. According to additional embodiments of the invention, the programmable device 42 includes a lookup table that has a plurality of programmable entries. The programmable entries may be derived from simulation results, and the simulation results may associate each multi-bit control word cw[k] with a corresponding VCO 50 output clock signal ckout. The VCO 50 output clock signal ckout may additionally correspond to a VCO 50 tuning voltage. The VCO 50 tuning voltage may be a voltage determined by the reference voltage VREF, and the VCO 50 tuning voltage may be at the center of a sub-band of the VCO 50.

The AFC circuit 20 may be configured to perform the look-up of the first multi-bit control word cw[k] from within the lookup table based on the frequency difference between the first clock signal and the second clock signal. For example, if the second clock signal has a frequency that is 10% greater than the first clock signal, then the first multi-bit control word cw[k] may correspond to a 10% difference between the first and second clock signals. In some embodiments, the first clock signal is the reference clock signal ckref. When the first clock signal is the reference clock signal ckref, the second clock signal may be the feedback clock signal ckfb derived from the VCO 50 output clock signal ckout.

Figure 2A:
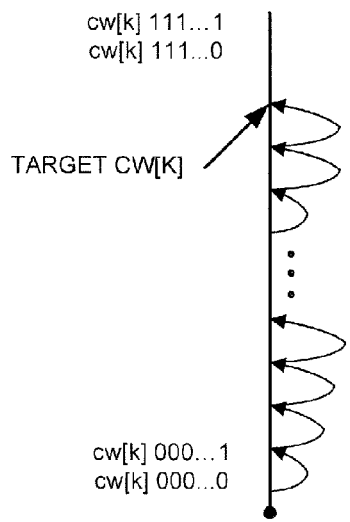
FIG. 2A is a diagram illustrating a conventional adaptive frequency calibration (AFC) control word search algorithm.
Figure 2B:
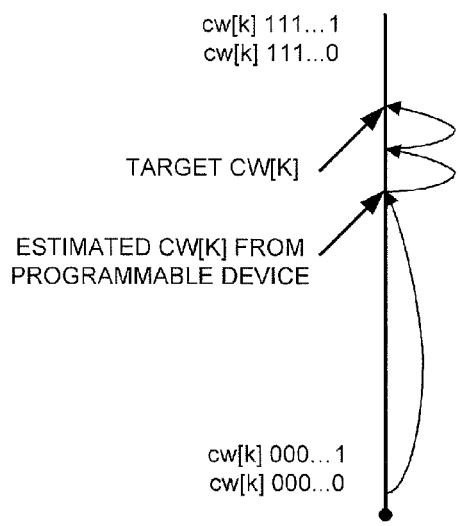
FIG. 2B is a diagram illustrating an AFC control word search algorithm according to embodiments of the present invention.

Referring now to FIG. 2B, the first multi-bit control word cw[k] that the AFC circuit 20 looks up from within the programmable device 42 may be an estimated multi-bit control word cw[k]. The estimated multi-bit control word cw[k] is an estimated value of the target multi-bit control word cw[k]. If the estimated multi-bit control word cw[k] selects the target multi-bit control word cw[k] immediately without requiring further comparisons or iterations, then the estimated multi-bit control word cw[k] is equal to the target control multi-bit word cw[k]. The lookup table, or the at least one register or other storage element included in the programmable device 42, may thus be embedded in the AFC circuit 20 control word cw[k] searching algorithm to provide estimated values. The simulation results within the programmable device 42 may be post layout simulation data estimating the VCO 50 output clock signal ckout corresponding to each sub-band of the VCO 50. The programmable device 42 may thereby include a multi-bit control word cw[k] mapped to each output clock signal ckout frequency value. When the simulation results do not immediately provide the target multi-bit control word cw[k] with the estimated multi-bit control word cw[k], the estimated multi-bit control word cw[k] can still minimize the amount of AFC circuit 20 control word cw[k] searching time by providing the estimated value close to the target value. Thus, the first multi-bit control word cw[k] may be determined by simulation results.

Figure 3:
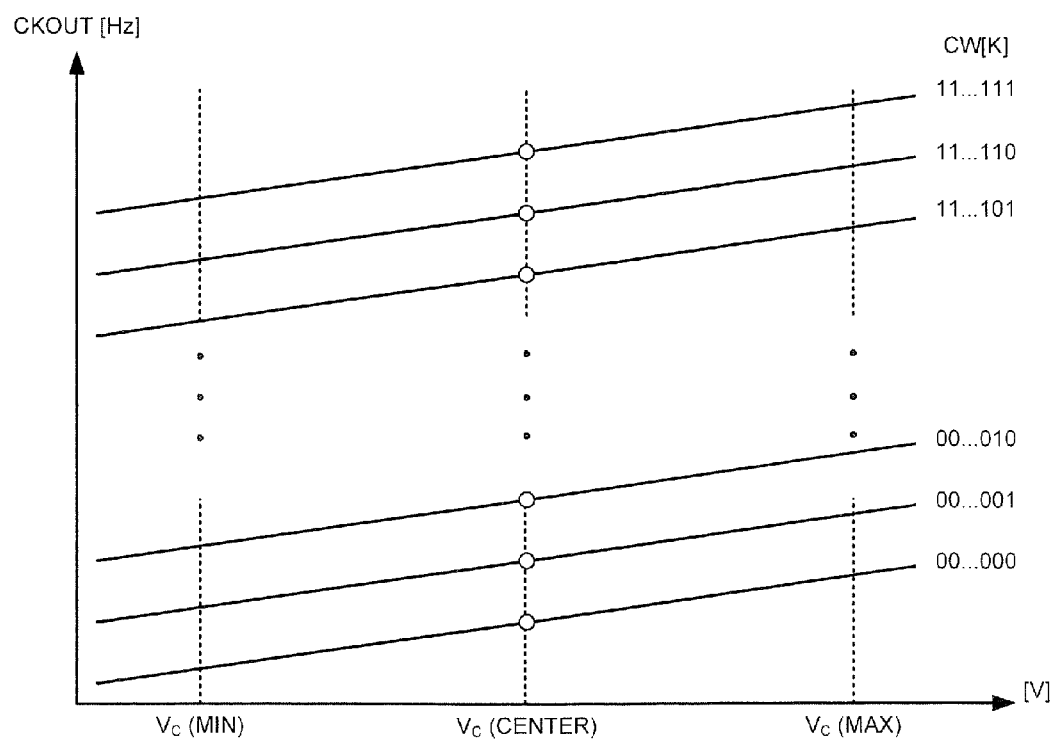
FIG. 3 is a graph illustrating a set of sub-bands associated with the voltage controlled oscillator (VCO) of FIG. 1.

Referring now to FIG. 3, each multi-bit control word cw[k] may be mapped to a corresponding VCO 50 output clock signal ckout frequency value. For example, the corresponding output clock signal ckout frequency value may be a point along a frequency sub-band, where the multi-bit control word cw[k] is mapped to the entire sub-band. The VCO 50 generates output clock signal ckout using the tuning voltage VC of the loop filter 90 and the multi-bit control word cw[k] selected by the AFC circuit 20. Each sub-band may be an operating characteristic curve of the VCO 50.

The tuning voltage along each sub-band may range from a minimum value $V_C$ MIN to a tuning voltage at a center point of each sub-band, $V_C$ CENTER, to a maximum value $V_C$ MAX. In FIG. 3, the center of each sub-band is illustrated with a circle. For example, the reference voltage VREF may equal the voltage at the center of a sub-band. And the values in the lookup table may correspond to the circled points in FIG. 3. As known to those skilled in the art, however, the reference voltage VREF may also have a value anywhere within the range from $V_C$ MIN to $V_C$ MAX.

According to additional embodiments of the invention, AFC circuit 20 is configured to select multi-bit control words cw[k] by using an algorithm that does not require the programmable device 42. For example, the AFC circuit 20 may use an algorithm that jumps to the first multi-bit control word cw[k]. Such an algorithm could be embedded within the state machine 40 to jump to the first multi-bit control word cw[k] based on the number of bits k in each multi-bit control word cw[k]. If each multi-bit control word cw[k] has 8 bits, then the AFC circuit 20 could minimize the time spent searching for the target multi-bit control word cw[k] by jumping to a first multi-bit control word cw[k] among the 256 multi-bit control words cw[k]. The AFC circuit 20 may choose a first multi-bit control word cw[k] near a dividing point, such as a midpoint, of a plurality of multi-bit control words cw[k]. By doing so, the AFC circuit 20 may then determine whether the target multi-bit control word cw[k] has a binary value smaller or greater than the first multi-bit control word cw[k], and exclude, such as by ignoring, from further searching multi-bit control words cw[k] whose values are greater or smaller, respectively, than the first multi-bit control word cw[k]. Also, the first multi-bit control word cw[k] may be determined by the reference voltage VREF.

After the AFC circuit 20 has jumped to the first multi-bit control word cw[k], it may jump to a second multi-bit control word cw[k]. Upon jumping to the second multi-bit control word cw[k], the AFC circuit 20 can determine, as described above, the position of the second multi-bit control word cw[k] relative to the target multi-bit control word cw[k], and then jump to a third multi-bit control word cw[k]. For jumps following the first multi-bit control word cw[k], the AFC circuit 20 can jump to either a multi-bit control word cw[k] with a smaller binary value or to a multi-bit control word cw[k] with a larger binary value. The AFC circuit 20 can thus jump in multiple directions when searching for the target multi-bit control word cw[k], and each jump can skip over a plurality of multi-bit control words cw[k]. The AFC circuit 20 can use such a jumping search process to narrow the number of multi-bit control words cw[k] searched before reaching the target multi-bit control word cw[k]. In some embodiments, the AFC circuit 20 may perform a specific number of jumps, such as based on the number of bits k in each multi-bit control word cw[k], and then search consecutively through multi-bit control words cw[k] to reach the target multi-bit control word cw[k].

Although the present invention has been particularly shown and described with reference to embodiments thereof, it will be understood by those of ordinary skill in the art that various changes in form and details may be made therein without departing from the spirit and scope of the present invention as defined by the following claims.

That which is claimed is:

1. A multi-band clock generator, comprising:
a phase-locked loop (PLL) integrated circuit responsive to first and second clock signals, said PLL integrated circuit having a multi-band voltage-controlled oscillator (VCO) therein responsive to a multi-bit control word that selects a frequency sub-band of the VCO; and
an adaptive frequency calibration (AFC) circuit responsive to the first and second clock signals, said AFC circuit configured to look-up an estimate of a target multi-bit control word, which is derived from a previously-determined control word having a value associated with a frequency lock of the multi-band clock generator and stored in a programmable device, during an operation to lock an output clock signal generated by the VCO to a frequency sub-band associated with the target multi-bit control word.

2. The clock generator of claim 1, wherein the sub-band of the VCO comprises a frequency characteristic curve.

3. The clock generator of claim 1, wherein the estimate of the target multi-bit control word is the target multi-bit control word.

4. The clock generator of claim 1, wherein the programmable device comprises at least one register configured to store a multi-bit control word.

5. The clock generator of claim 1, wherein the programmable device comprises a lookup table having a plurality of programmable entries therein.

6. The clock generator of claim 5, wherein the first clock signal is a reference clock signal; and wherein said AFC circuit is configured to detect a frequency of the reference clock signal.

7. The clock generator of claim 6, wherein the second clock signal is a feedback clock signal derived from the output clock signal; and wherein said AFC circuit is configured to detect a frequency of the feedback clock signal and to perform the look-up of the estimate of the target multi-bit control word from within the lookup table based on the frequency difference between the reference clock signal and the feedback clock signal.

8. The clock generator of claim 5, wherein the programmable entries are derived from simulation results.

9. The clock generator of claim 8, wherein the simulation results associate each multi-bit control word with a corresponding output clock signal at a VCO tuning voltage.

10. The clock generator of claim 9, wherein the VCO tuning voltage is determined by a reference voltage.

11. A multi-band clock generator, comprising:
a phase-locked loop (PLL) integrated circuit responsive to first and second clock signals, said PLL integrated circuit having a multi-band voltage-controlled oscillator (VCO) therein responsive to a multi-bit control word that selects a frequency sub-band of the VCO; and
an adaptive frequency calibration (AFC) circuit responsive to the first and second clock signals, said AFC circuit configured to select a first multi-bit control word using a multi-directional jumping algorithm that jumps a plurality of multi-bit control words during an operation to lock an output clock signal generated by the VCO to a frequency sub-band associated with a target multi-bit control word.

12. The clock generator of claim 11, wherein the multi-directional jumping algorithm selects the first multi-bit control word by jumping to a given point among the plurality of multi-bit control words.

13. The clock generator of claim 12, wherein the given point is a midpoint among the plurality of multi-bit control words.

14. The clock generator of claim 12, wherein the given point is determined by a reference voltage.

15. The clock generator of claim 12, wherein the mufti-directional jumping algorithm ignores multi-bit control words having binary values greater than the first multi-bit control word.

16. The clock generator of claim 12, wherein the multi-directional jumping algorithm ignores multi-bit control words having binary values smaller than the first multi-bit control word.

17. A multi-band clock generator, comprising:
a phase-locked loop (PLL) integrated circuit responsive to first and second clock signals, said PLL integrated circuit having a multi-band voltage-controlled oscillator (VCO) therein responsive to a multi-bit control word that sets a frequency characteristic curve of the VCO; and
an adaptive frequency calibration (AFC) circuit responsive to the first and second clock signals, said AFC circuit configured to look-up an estimate of a target multi-bit control word, which is derived from a previously-determined lock condition associated with the multi-hand clock generator and stored in a programmable device, during an operation to lock an output clock signal generated by the VCO to a first frequency characteristic curve associated with the target multi-bit control word.

18. The clock generator of claim 17, wherein the programmable device comprises at least one register configured to store a multi-bit control word.

19. The clock, generator of claim 17, wherein the programmable device comprises a lookup table having a plurality of programmable entries therein.

20. The clock generator of claim 19, wherein the first clock signal is a reference clock signal and the second clock signal is a feedback clock signal derived from the output clock signal; and
wherein said AFC circuit is configured to detect a frequency of the reference clock signal and a frequency of the feedback clock signal and to perform the look-up of the estimate of the target multi-bit control word from within the lookup table based on the frequency difference between the reference clock signal and the feedback clock signal.

21. The clock generator of claim 17, wherein the estimate of the target multi-bit control word is derived from a simulation result stored in the programmable device.

* * * * *